United States Patent
Zhang et al.

(10) Patent No.: US 11,540,403 B2
(45) Date of Patent: Dec. 27, 2022

(54) DISPLAY PANEL WITH FLEXIBLE CIRCUIT BOARD

(71) Applicants: Beijing BOE Display Technology Co., Ltd., Beijing (CN); BOE Technology Group Co., Ltd., Beijing (CN)

(72) Inventors: Jiangfeng Zhang, Beijing (CN); Xu Chen, Beijing (CN); Yu Zhang, Beijing (CN); Bochang Wang, Beijing (CN); Shixin Geng, Beijing (CN)

(73) Assignees: BEIJING BOE DISPLAY TECHNOLOGY CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 97 days.

(21) Appl. No.: 16/962,588

(22) PCT Filed: Jul. 23, 2019

(86) PCT No.: PCT/CN2019/097309
§ 371 (c)(1),
(2) Date: Jul. 16, 2020

(87) PCT Pub. No.: WO2021/012185
PCT Pub. Date: Jan. 28, 2021

(65) Prior Publication Data
US 2022/0007524 A1    Jan. 6, 2022

(51) Int. Cl.
*H05K 5/02*    (2006.01)
*G06F 1/18*    (2006.01)

(52) U.S. Cl.
CPC ............ *H05K 5/0217* (2013.01); *G06F 1/181* (2013.01)

(58) Field of Classification Search
CPC ..................... H05K 5/0217; G06F 1/181
See application file for complete search history.

(56) References Cited

U.S. PATENT DOCUMENTS

| 2002/0080297 A1* | 6/2002 | Sung | G06F 1/1601 |
| | | | 349/58 |
| 2016/0044802 A1* | 2/2016 | Kim | G02F 1/133308 |
| | | | 361/679.01 |
| 2020/0323087 A1* | 10/2020 | Hwang | G06F 1/1601 |

FOREIGN PATENT DOCUMENTS

| CN | 101738752 A | 6/2010 |
| CN | 101964890 A | 2/2011 |

(Continued)

OTHER PUBLICATIONS

Office Action dated Apr. 28, 2022 issued in corresponding Chinese Application No. 201980001129.5.

*Primary Examiner* — James Wu
*Assistant Examiner* — Hung Q Dang
(74) *Attorney, Agent, or Firm* — Nath, Goldberg & Meyer; Joshua B. Goldberg

(57) ABSTRACT

A display panel includes: a front frame and a printed circuit board protective shell. The front frame includes a first front frame portion and a second front frame portion extending in a length direction of the display panel; and a third front frame portion and a fourth front frame portion extending in a width direction of the display panel; wherein the first front frame portion and the second front frame portion are disposed oppositely; and the third front frame portion and the fourth front frame portion are disposed oppositely, and connected between the first front frame portion and the second front frame portion. The printed circuit board protective shell is engaged with the first front frame portion and the second front frame portion to form an integral structure.

12 Claims, 14 Drawing Sheets

(56) References Cited

FOREIGN PATENT DOCUMENTS

| | | |
|---|---|---|
| CN | 202394014 U | 8/2012 |
| CN | 104297961 A | 1/2015 |
| CN | 204652825 U | 9/2015 |
| CN | 205016152 U | 2/2016 |
| CN | 205787466 U | 12/2016 |
| CN | 206349112 U | 7/2017 |
| CN | 206818982 U | 12/2017 |
| CN | 207473481 U | 6/2018 |
| CN | 207818099 U | 9/2018 |
| CN | 108803106 A | 11/2018 |
| CN | 208477265 U | 2/2019 |

\* cited by examiner

DISPLAY PANEL WITH FLEXIBLE CIRCUIT BOARD

TECHNICAL FIELD

The present disclosure belongs to the field of display technologies, and particularly relates to a display panel.

BACKGROUND

With the rapid development of the display technology, more and more forms of screens appear in our visual field. In the commercial display field, the non-mainstream aspect ratio (an aspect ratio≥3:1) of the strip screen get more and more concerns in the market. For example, strip screens with aspect ratios of 3:1, 5:1, 10:1 have gradually emerged in the market, but with the explosion of market demands, the requirements on the aspect ratio are more and more extreme.

SUMMARY

To solve at least one of the problems in the related art, the present disclosure provides a display panel and a display device.

In a first aspect, the present disclosure provides a display panel, including:

a front frame including a first front frame portion and a second front frame portion extending in a length direction of the display panel; and a third front frame portion and a fourth front frame portion extending in a width direction of the display panel; wherein the first front frame portion and the second front frame portion are disposed oppositely; and the third front frame portion and the fourth front frame portion are disposed oppositely, and connected between the first front frame portion and the second front frame portion; and a printed circuit board protective shell engaged with the first front frame portion.

Optionally, the first front frame portion includes a first side plate, and a first connecting plate connected at an edge of the first side plate in a length direction thereof and extending toward a direction of the printed circuit board protective shell; and the second front frame portion includes a second side plate, and a second connecting plate connected at an edge of the second side plate in a length direction thereof and extending toward the direction of the printed circuit board protective shell.

Optionally, the printed circuit board protective shell includes a casing, and a first casing connecting portion connected at an edge of the casing in a length direction thereof and extending toward a direction of the first side plate; wherein an edge of the first casing connecting portion in a length direction thereof is connected to a first engaging portion; a first engaging slot is disposed on the first connecting plate; and the first casing connecting portion and the first engaging slot are connected in a one-to-one correspondence manner.

Optionally, the first front frame portion corresponds to a position of a flexible circuit board of the display panel; and the edge of the first connecting plate in the length direction thereof is bent inward and extends in a direction away from the first side plate. Optionally, the edge of the first connecting plate in the length direction thereof includes a bent depth of: 1.4 mm.

Optionally, the display panel further includes a backplane; the backplane includes: a bottom plate, and a first bottom plate connecting portion and a second bottom plate connecting portion connected to an edge of the bottom plate in a length direction thereof and disposed oppositely; wherein the first bottom plate connecting portion is connected to the first connecting plate through a first screw; and the second bottom plate connecting portion is connected to the second connecting plate through a second screw.

Optionally, the first bottom plate connecting portion is provided with a first rivet stud; the first rivet stud and the first screw are disposed in a one-to-one correspondence manner; and the screw connects the first connecting plate to the first bottom plate connecting portion via the first rivet stud;

the second bottom plate connecting portion is provided with a second rivet stud; the second rivet stud and the second screw are disposed in a one-to-one correspondence manner; and the second screw connects the second connecting plate to the second bottom plate connecting portion via the second rivet stud.

Optionally, the display panel further includes a middle frame; the middle frame includes a first middle frame portion and a second middle frame portion extending along a length direction of the display panel and disposed oppositely; wherein the first middle frame portion is engaged with the first bottom plate connecting portion; and the second middle frame portion is engaged with the second bottom plate connecting portion.

Optionally, a second engaging slot is disposed on the first middle frame portion, a second engaging portion is disposed on the first bottom plate connecting portion, and the second engaging slot and the second engaging portion are disposed in a one-to-one correspondence manner and engaged with each other; and a third engaging slot is disposed on the second middle frame portion, a third engaging portion is disposed on the second bottom plate connecting portion, and the third engaging slot and the third engaging portion are disposed in a one-to-one correspondence manner and engaged with each other.

Optionally, the second engaging portion and the first screw are alternatively disposed; and the third engaging portion and the second screw are alternatively disposed.

Optionally, a plurality of first reinforcing ribs spaced apart are disposed on the bottom plate of the backplane.

Optionally, the first reinforcing ribs are bosses formed on the bottom plate.

Optionally, each of the bosses has an arched shape at a corner position.

Optionally, the printed circuit board protective shell includes a casing, and a first casing connecting portion and a second casing connecting portion obtained by bending from an edge in a width direction of the casing and extending in a direction away from the casing; and the first casing connecting portion and the second casing connecting portion are both connected to the backplane.

Optionally, a convex rib is disposed at a support corner position of each of the first casing connecting portion and the second casing connecting portion.

Optionally, each of the first casing connecting portion and the second casing connecting portion is provided with two convex ribs at the support corner position.

Optionally, the casing has a second reinforcing rib.

Optionally, the second reinforcing rib includes an I-shaped reinforcing rib formed on the casing.

Optionally, the display panel includes an aspect ratio of 20:1 to 24:1.

The present disclosure has the following beneficial effects:

The display panel of the present disclosure is a display module with a very large aspect ratio, in which the front frame of the display panel is engaged with the printed circuit board protective shell, and an integrated assembly structure is adopted to enhance the overall strength of the display panel; the bending design of the first connecting plate in the first frame portion of the front frame, the rectangular and divided reinforcing ribs on the backplane, the closed and continuous I-shaped reinforcing ribs adopted by the printed circuit board protective shell, the scheme of locking and attaching the front frame and the backplane by an optimized screw arrangement, and the backplane abutting the middle frame, all effectively enhance the strength of the display panel.

DETAILED DESCRIPTION OF THE EMBODIMENTS

To improve understanding of the technical solution of the present disclosure for those skilled in the art, the present disclosure will now be described in detail with the help of accompanying drawings and specific implementations.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components. Also, the use of the terms "a", "an", or "the" and similar referents do not denote a limitation of quantity, but rather denote the presence of at least one. The word "comprising" or "comprises" or the like means that the element or item preceding the word includes elements or items that appear after the word or equivalents thereof, but does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may also be changed accordingly.

In a first aspect, an embodiment of the present disclosure provides a display panel of a very large aspect ratio, which may be 20:1, or even 24:1. That is, the display panel of the embodiment of the present disclosure has a length much greater than the width thereof. To ensure stability of the display panel in the length direction, strength of some modules in the display panel in the length direction needs to be reinforced by design.

Obviously, the aspect ratio of the display panel in the embodiment of the present disclosure is not limited to 20:1 or 24:1, but may be any aspect ratio between 20:1 or 24:1, or display panels with different aspect ratios may be prepared according to specific application scenarios.

Figure 1:
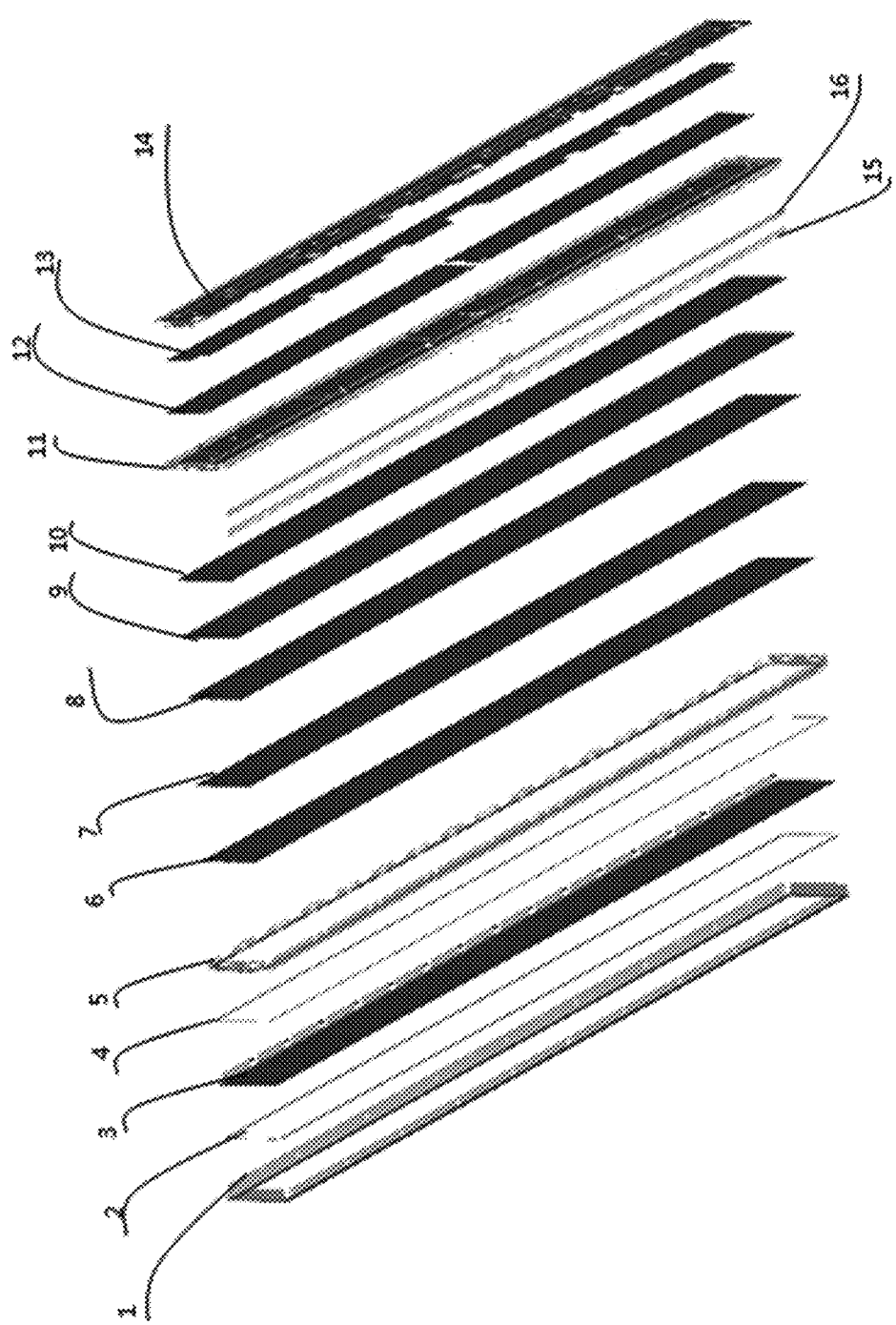
FIG. 1 is a schematic structural view of a display panel according to an embodiment of the present disclosure.
Figure 2:
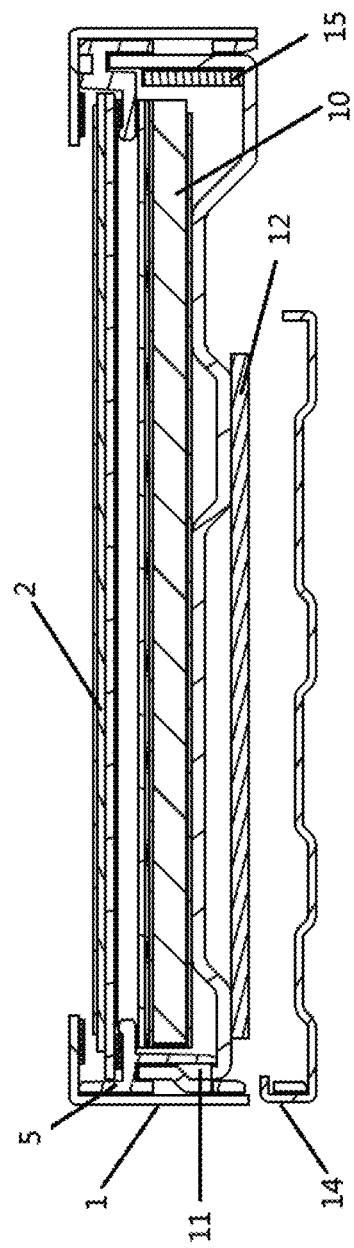
FIG. 2 is a cross-sectional view of a display panel according to an embodiment of the present disclosure.

Hereinafter, structures of the respective modules in the display panel according to the embodiment of the present disclosure will be briefly described. As shown in FIGS. 1 and 2, where FIG. 1 is a schematic structural view of a display panel according to an embodiment of the present disclosure; and FIG. 2 is a cross-sectional view of a display panel according to an embodiment of the present disclosure, the display panel sequentially includes from front to back: a front frame 1, a first buffer structure 2, a display module 3, a second buffer structure 4, a middle frame 5, a backlight module (including, sequentially disposed, a brightness enhancement film 6, a first diffusion sheet 7, a second diffusion sheet 8, a light guide plate 9, a reflective sheet 10, an LED light bar 15 at a side edge of the light guide plate 9, a thermal conductive adhesive 16 on the LED light bar 15, silica gel blocks on four corners of the light guide plate 9), a backplane 11, a printed circuit board (FPC) 12, an isolation insulating layer 13, a printed circuit board protective shell 14.

It should be noted here that the printed circuit board 12 is connected to the display module 3 by a flexible circuit board bonding (COF), and then folded to the back of the backplane 11; the isolation insulating layer 13 is coated on a layer of electronic devices of the printed circuit board 12, so as to prevent pins of the electronic devices on the printed circuit board 12 from being shorted with the printed circuit board protective shell 14, which may cause poor display of the display panel. The first buffer structure 2 may be specifically made of foam material, and the second buffer structure 4 may be specifically made of a rubber material; and the first buffer structure 2 and the second buffer structure 4 are both configured to prevent the display panel from being damaged under impact of an external force. The thermal conductive adhesive 16 coated on the LED light bar 15 is configured to conduct heat generated by the LED light bar 15 emitting light for a long time to the backplane 11 for heat dissipation.

Since the display panel of this embodiment has a large aspect ratio, in some embodiments of the present disclosure, the backplane 11 may be made of a material including a 0.8t of Electrolytically Galvanized Steel Sheet (EGI) base material; and the printed circuit board protective shell 14 may be made of a material including a 0.5t EGI base material. Obviously, the materials of the backplane 11 and the printed circuit board protective shell 14 are not limited to the above base materials, and a specific type of base material may be selected according to the size of a specific product.

It should be noted here that in the embodiments of the present disclosure, the length direction of the display panel is an extending direction of a longer side of the display panel, and the width direction of the display panel is an extending direction of a shorter side of the display panel.

Figure 3:
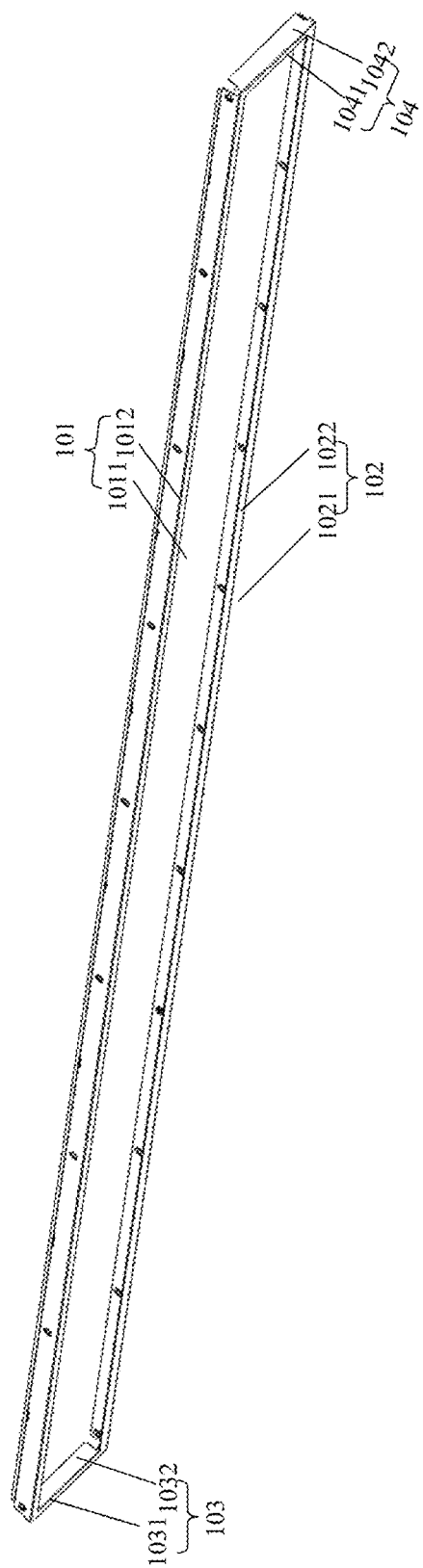
FIG. 3 is a schematic structural view of a front frame of a display panel according to an embodiment of the present disclosure.

In some embodiments of the present disclosure, as shown in FIG. 3, which is a schematic structural view of a front frame of a display panel according to an embodiment of the present disclosure, the front frame 1 of the display panel includes a first front frame portion 101 and a second front frame portion 102 extending in a length direction of the display panel, and a third front frame portion 103 and a fourth front frame portion 104 extending in a width direction of the display panel. The first front frame portion 101 and the second front frame portion 102 are disposed oppositely; and the third front frame portion 103 and the fourth front frame portion 104 are disposed oppositely; and the third front frame portion 103 and the fourth front frame portion 104 are connected between the first front frame portion 101 and the second front frame portion 102. Specifically, as shown in FIG. 1, the display panel may be a rectangular frame enclosed by the first front frame portion 101, the second front frame portion 102, the third front frame portion 103, and the fourth front frame portion 104. However, it will be appreciated that the display panel in the embodiment of the present disclosure is not limited to a rectangular frame, but may have other polygonal structures. In the following, the rectangular display panel is taken as an example for illustration.

The printed circuit board protective shell 14 in the display panel is engaged with the first front frame portion 101 of the front frame 1 so that the front frame 1 and the printed circuit board protective shell 14 are relatively fixed. In this way, even if the stability of the front frame 1 is relatively weak due to the narrowing of the display panel and the large dimension in the length direction, since the front frame 1 and the printed circuit board protective shell 14 in the embodiment of the present disclosure are engaged with each other, the stability of the front frame 1 can be ensured by the strength of the printed circuit board protective shell 14, thereby enhancing the strength of the entire display panel.

In some embodiments of the present disclosure, the first front frame portion 101 of the front frame 1 of the display panel includes a first side plate 1011, and a first connecting plate 1012 connected at an edge of the first side plate 1011 in a length direction thereof and extending toward a direction of the printed circuit board protective shell 104; and the second front frame portion 102 includes a second side plate 1021, and a second connecting plate 1022 connected at an edge of the second side plate 1021 in a length direction thereof and extending toward the direction of the printed circuit board protective shell 104; the third front frame portion 103 includes a third side plate 1031, and a third connecting plate 1032 connected at an edge of the third side plate 1031 in a length direction thereof and extending toward the direction of the printed circuit board protective shell 104; and the fourth front frame portion 104 includes a fourth side plate 1041, and a fourth connecting plate 1042 connected at an edge of the fourth side plate 1041 in a length direction thereof and extending toward the direction of the printed circuit board protective shell 104. The first side plate 1011, the second side plate 1021, the third side plate 1031 and the fourth side plate 1041 enclose a rectangular structure; and the first connecting plate 1012, the second connecting plate 1022, the third connecting plate 1032, and the fourth connecting plate 1042 enclose a structure having a rectangular contour.

It should be noted here that the first side plate 1011, the second side plate 1021, the third side plate 1031, and the fourth side plate 1041 may each include a first side and a second side extending along the length direction of the display panel, and a third side and a fourth side extending along the width direction of the display panel. The first side and the second side are disposed oppositely, and the third side and the fourth side are disposed oppositely and connected between the first side and the second side. The edges in the length direction of the first side plate 1011, the second side plate 1021, the third side plate 1031, and the fourth side plate 1041 in the embodiment of the present disclosure refer to the positions of their first sides, respectively.

The first connecting plate 1012 may be obtained by bending the first side of the first side plate 1011 inward, the second connecting plate 1022 may be obtained by bending the first side of the second side plate 1021 inward, the third connecting plate 1032 may be obtained by bending the first side of the third side plate 1031 inward, and the fourth connecting plate 1042 may be obtained by bending the fourth side plate 1041 inward. When the front frame 1 is assembled with the printed circuit board protective shell 14, first connecting plate 1012, the second connecting plate 1022, the third connecting plate 1032, and the fourth connecting plate 1042 each extend toward the direction of the printed circuit board protective shell 14.

Figure 4:
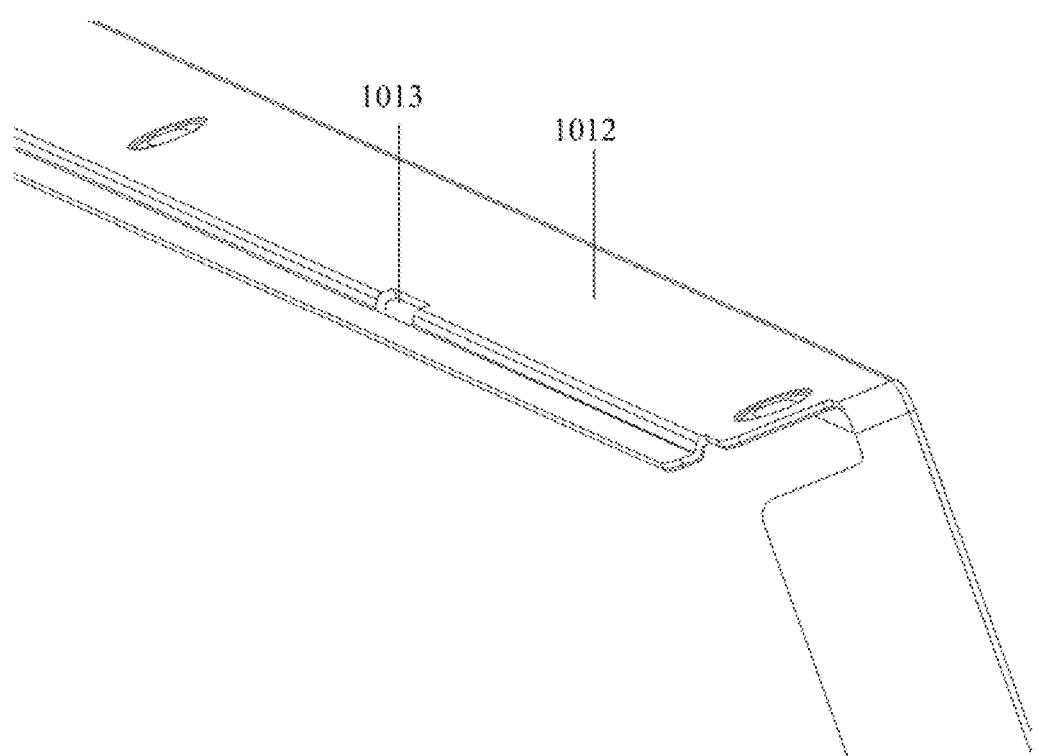
FIG. 4 is a partially enlarged view of a front frame of a display panel according to an embodiment of the present disclosure.

As shown in FIG. 4, which is a partially enlarged view of a front frame of a display panel according to an embodiment of the present disclosure, the first front frame portion 101 is located at a position corresponding to the flexible circuit board in the display panel, and the second front frame portion 102 is located at a position corresponding to the LED light bar 15 in the display panel; and a plurality of first engaging slots 1013 are disposed on the first connecting plate 1012.

Figure 5:
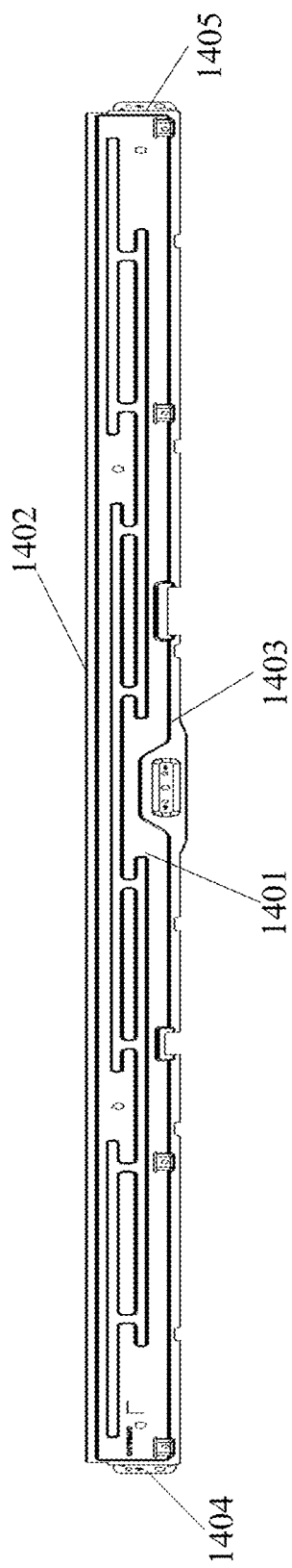
FIG. 5 is a schematic structural view of a printed circuit board protective shell of a display panel according to an embodiment of the present disclosure.

As shown in FIG. 5, which is a schematic structural view of a printed circuit board protective shell of a display panel according to an embodiment of the present disclosure, the printed circuit board protective shell 14 may include a casing 1401, a first casing connecting portion 1402 and a second casing connecting portion 1403 connected to an edge of the casing 1401 in a length direction thereof, respectively, and a third casing connecting portion 1404 and a fourth casing connecting portion 1405 connected to edges of the casing 1401 in a length direction and in width direction thereof, respectively. It should be noted here that the length direction of the casing 1401 is the same as that of the display panel, and the width direction of the casing 1401 is the same as that of the display panel.

The first casing connecting portion 1402 and the second casing connecting portion 1403 are respectively obtained by bending the edge of the casing 1041 in the length direction inward so that when the printed circuit board protective shell 14 is assembled with the front frame 1, the first casing connecting portion 1402 and the second casing connecting portion 1403 point to the front frame 1, and the first casing connecting portion 1402 is opposite to the first connecting plate 1012, while the second casing connecting portion 1403 is opposite to the second connecting plate 1022. The third casing connecting portion 1404 and the fourth casing connecting portion 1405 are obtained by respectively bending the edge of the casing 1041 in the width direction first inward, and then toward a direction away from the casing 1405 so that when the printed circuit board protective shell 14 is assembled with the backplane 11, the third casing connecting portion 1404 and the fourth casing connecting portion 1405 are fixed to the backplane 11.

Figure 6:
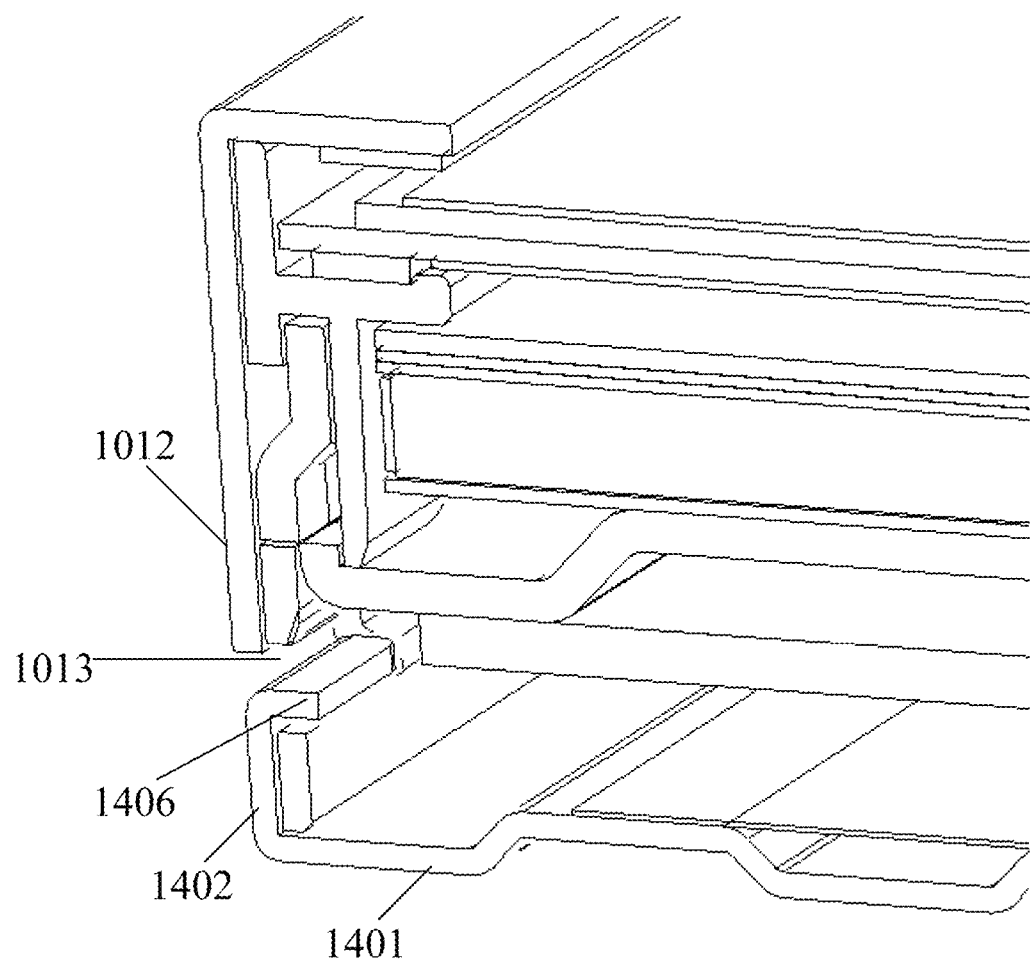
FIG. 6 is a schematic structural view illustrating a front frame of a display panel engaged with a printed circuit board according to an embodiment of the present disclosure.

Specifically, as shown in FIG. 6, which is a schematic structural view illustrating a front frame of a display panel engaged with a printed circuit board according to an embodiment of the present disclosure, a plurality of first engaging portions 1406 are disposed on the first casing connecting portion 1402 of the printed circuit board protective shell 14; while a plurality of first engaging slots 1013 are disposed on the first connecting plate 1012 of the front frame 1. The first engaging portions 1406 are connected to the first engaging slots 1013 in a one-to-one correspondence manner, so as to complete assembly of the printed circuit board protective shell 14 and the front frame 2.

Figure 7:
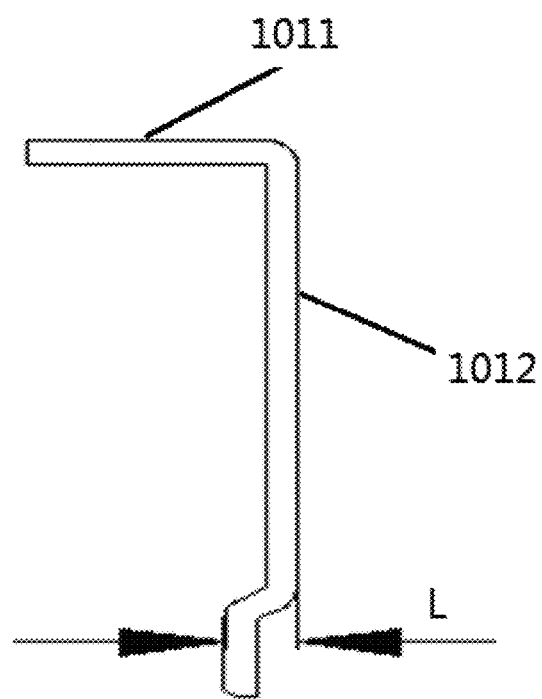
FIG. 7 is a partially enlarged view of a first front frame portion of a display panel according to an embodiment of the present disclosure.

The second casing connecting portion 1403 of the printed circuit board protective shell 14 wraps the printed circuit board 12 inside the printed circuit board protective shell 14. The third casing connecting portion 1404 and the fourth casing connecting portion 1405 are fixed to the backplane 11. In some embodiments of the present disclosure, as shown in FIG. 7, which is a partially enlarged view of a first front frame portion of a display panel according to an embodiment of the present disclosure, the edge of the first connecting plate 1012 of the first front frame portion 101 in the length direction is bent inward and extends in a direction away from the first side plate 1011. That is, the edge of the first connection plate 1012 is designed to be bent, thereby having an effect of reinforcing the strength of the first connection plate 1012 in the length direction. Specifically, the edge of the first connecting plate 1012 in the length direction thereof includes a bent depth of: 1.4 mm, i.e., the bending offset is L=1.4 mm. Apparently, the bending offset may also be specifically set according to the length of the first connecting plate.

Figure 8:
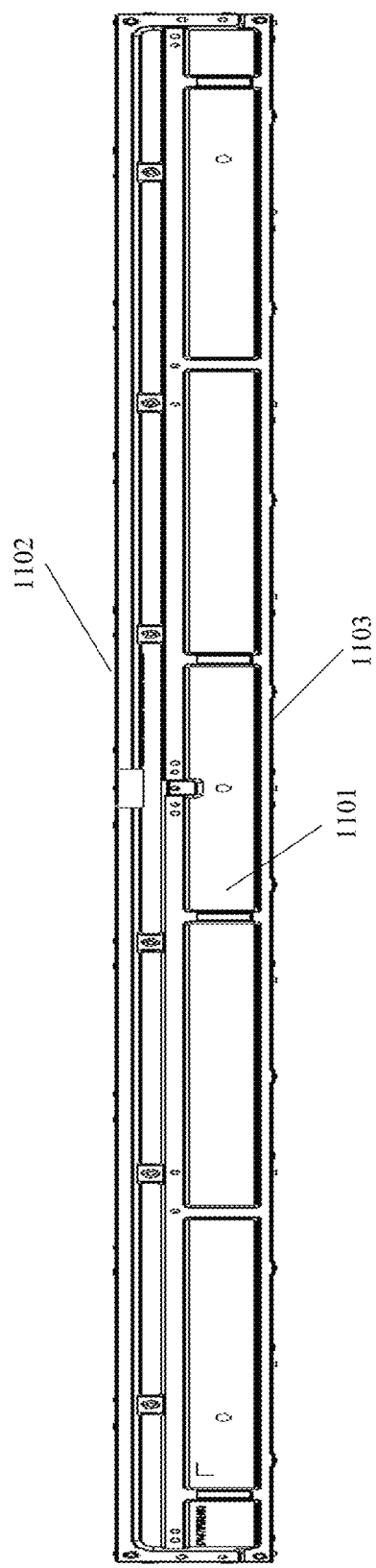
FIG. 8 is a schematic structural view of a backplane of a display panel according to an embodiment of the present disclosure.

In some embodiments of the present disclosure, as shown in FIG. 8, which is a schematic structural view of a backplane of a display panel according to an embodiment of the present disclosure, the backplane in the display panel includes: a bottom plate 1101, and a first bottom plate connecting portion 1102 and a second bottom plate connecting portion 1103 connected to an edge of the bottom plate in a length direction thereof and disposed oppositely. The first bottom plate connecting portion 1102 is connected to the first connecting plate 1012 through a first screw 17; and the second bottom plate connecting portion is connected to the second connecting plate through a second screw (not shown).

Figure 9:
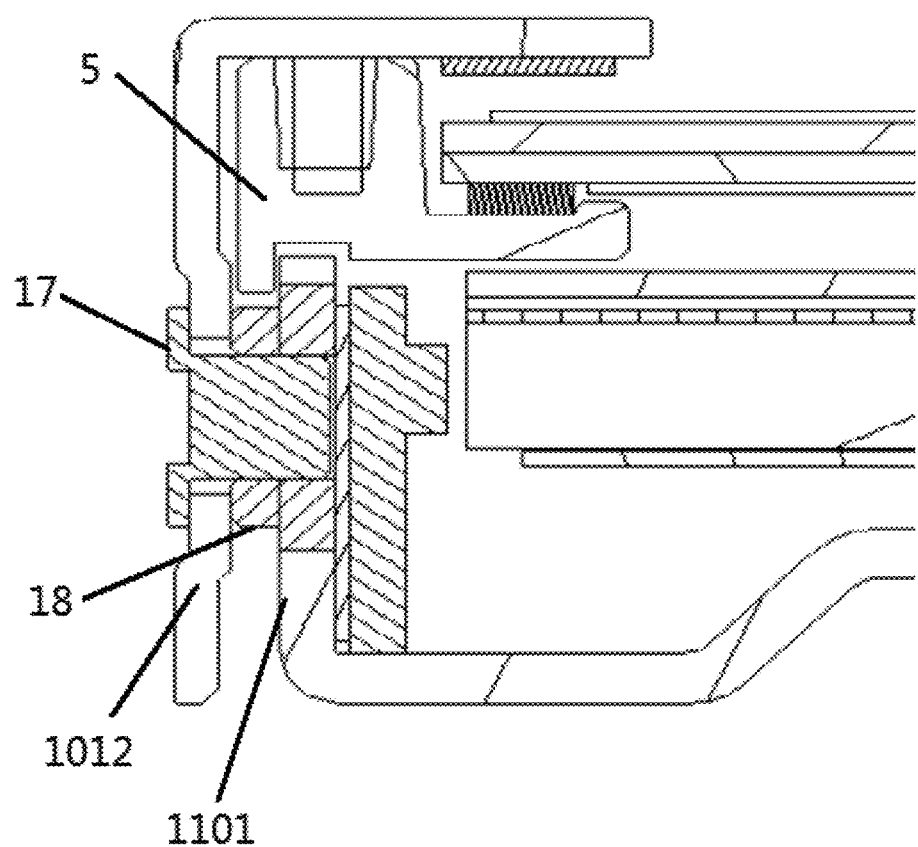
FIG. 9 is a schematic view illustrating the connection between the backplane and the front frame of the display panel according to an embodiment of the present disclosure.

Specifically, as shown in FIG. 9, which is a schematic view illustrating the connection between the backplane and the front frame of the display panel according to an embodiment of the present disclosure, a first rivet stud 18 is disposed in a space between the first connecting plate 1012 of the front frame 1 and the first bottom plate connecting portion 1102 of the backplane 11, and the first rivet stud 18 is riveted on the first bottom plate connecting portion 1102 and disposed in a one-to-one correspondence manner with the first screw 17. The first screw 17 connects the first connecting plate 1012 to the first bottom plate connecting portion 1102 via the first rivet stud 18. It will be appreciated that the first connecting plate 1012 and the first bottom plate connecting portion 1102 are provided with holes disposed in a one-to-one correspondence manner with the first rivet stud 18, respectively, and the first rivet stud 18 is riveted in the hole of the bottom plate connecting portion 1102. In this manner, the first screw 17 passes through the hole in the first connecting plate 1012 and the first rivet stud 18 to be connected to the first bottom plate connecting portion 1102.

Accordingly, a second rivet stud is arranged in a space between the second connecting plate 1022 and the second bottom plate connecting portion 1103, and the second rivet stud is riveted on the second bottom plate connecting portion 1103, and disposed in a one-to-one correspondence manner with the second screw. The second screw connects the second connecting plate 1022 to the second bottom plate connecting portion 1103 via the second rivet stud. It will be appreciated that the second connecting plate 1022 and the second bottom plate connecting portion 1103 are provided with holes disposed in a one-to-one correspondence manner with the second rivet stud, respectively, and the second rivet stud is riveted in the hole of the second bottom plate connecting portion 1103. In this manner, the second screw passes through the hole in the second connecting plate 1022 and the second rivet stud to be connected to the second bottom plate connecting portion 1103.

The number of the first screws may be less than that of the second screws. Specifically, there may be 9 first screws and 11 second screws. The first screws 17 and the second screws may be staggered in the spatial position to ensure secure fixation between the backplane 11 and the front frame 2.

Figure 10:
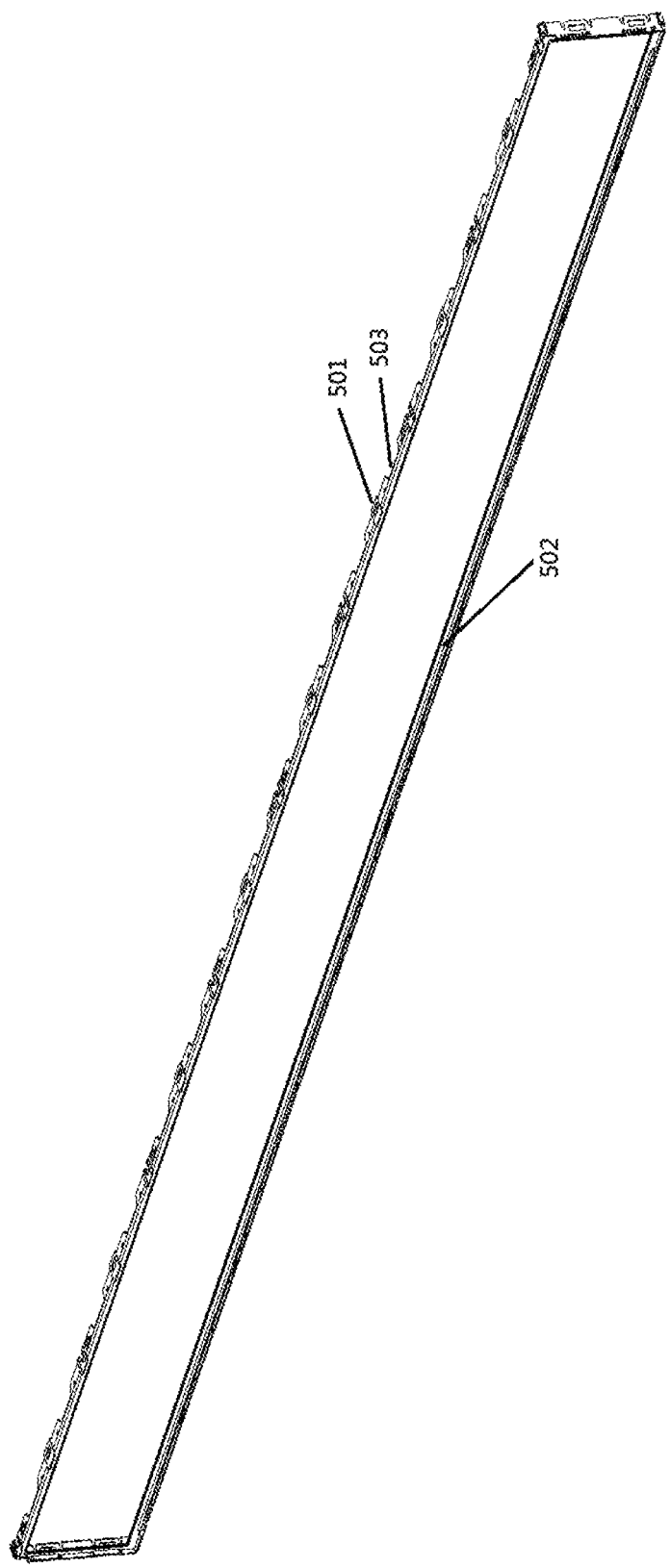
FIG. 10 is a schematic structural view of a middle frame of a display panel according to an embodiment of the present disclosure.

In some embodiments of the present disclosure, as shown in FIG. 10, which is a schematic structural view of a middle frame of a display panel according to an embodiment of the present disclosure, the middle frame of the display panel includes a first middle frame portion 501 and a second middle frame portion 502 extending along a length direction of the display panel and disposed oppositely. The first middle frame portion 501 is engaged with the first bottom plate connecting portion 1102; and the second middle frame portion 502 is engaged with the second bottom plate connecting portion 1103.

Figure 11:
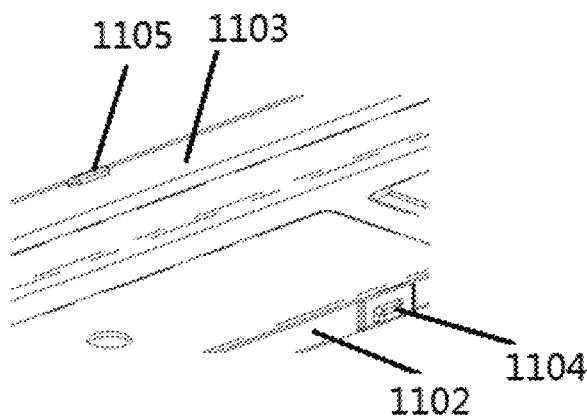
FIG. 11 is a partially enlarged view of a backplane of a display panel according to an embodiment of the present disclosure.
Figure 12:
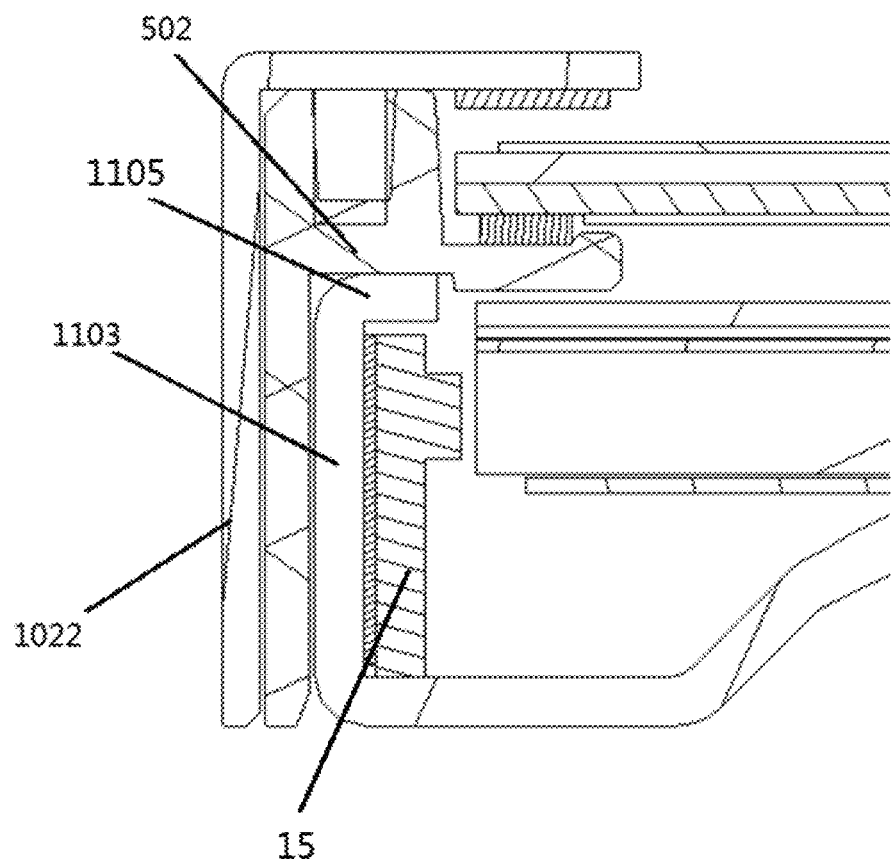
FIG. 12 is a schematic view illustrating the connection of the front frame, the backplane and the middle frame of the display panel according to an embodiment of the present disclosure.

Specifically, as shown in FIGS. 10-12, where FIG. 11 is a partially enlarged view of a backplane of a display panel according to an embodiment of the present disclosure; and FIG. 12 is a schematic view illustrating the connection of the front frame, the backplane and the middle frame of the display panel according to the embodiment of the present disclosure, a second engaging slot 503 is disposed on the first middle frame portion 501 of the middle frame 5, a second engaging portion 1104 is disposed on the first bottom plate connecting portion 1102, the second engaging slot 503 and the second engaging portion 1104 are disposed in a one-to-one correspondence manner and engaged with each other; and a third engaging slot (not shown) is disposed on the second middle frame portion 502, a third engaging portion is disposed on the second bottom plate connecting portion 1103 (not shown), the third engaging slot and the third engaging portion are disposed in a one-to-one correspondence manner and engaged with each other.

The second engaging portion 1104 and the first screw 17 are alternatively disposed; and the third engaging portion and the second screw are alternatively disposed. In this manner, better fixation of the backplane, the middle frame and the front frame can be achieved.

As shown in FIGS. 11 and 12, an edge in the length direction of the second bottom plate connecting portion 1103 of the backplane 11 has a plurality of bent portions 1105 bent inward for vertically limiting the LED light bar 15 and for abutting against the second middle frame portion 502 to fix the middle frame 5. Specifically, six bent portions 1105 may be provided, and each of the bent portions 1105 may have a length and width of 6×2. Obviously, the number and dimensions of the bent portions 1105 may be specifically set according to the length of the display panel.

Figure 13:
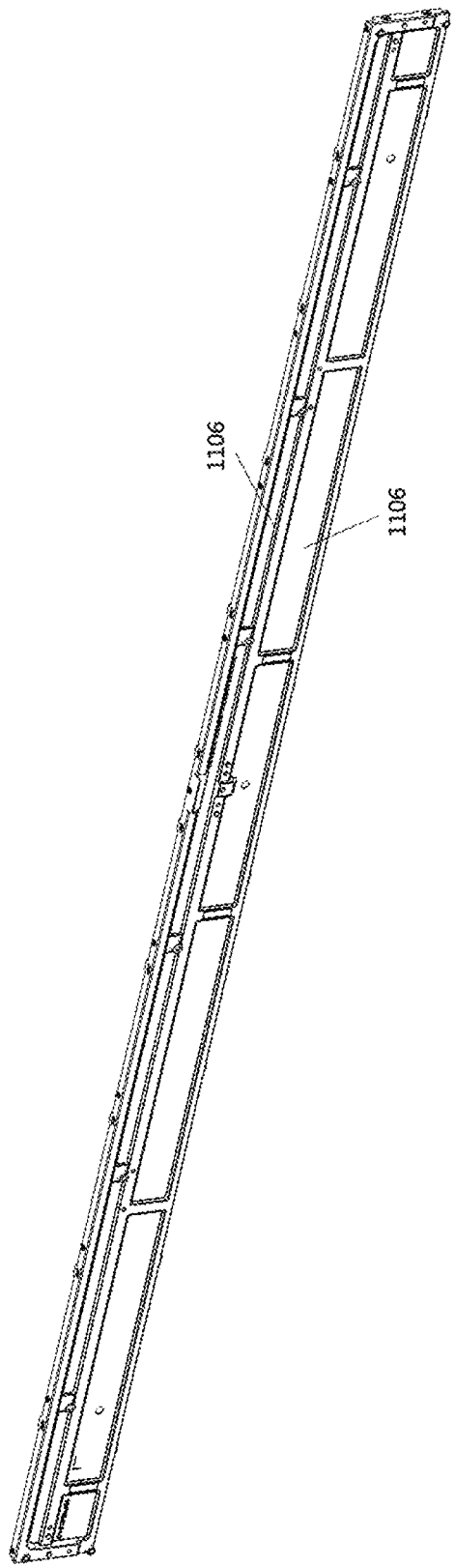
FIG. 13 is a schematic structural view of first reinforcing ribs on the backplane of the display panel according to an embodiment of the present disclosure.

In some embodiments of the present disclosure, as shown in FIG. 13, which is a schematic structural view of first reinforcing ribs on the backplane of the display panel according to an embodiment of the present disclosure, a plurality of first reinforcing ribs 1106 spaced apart are disposed on the bottom plate 1101 of the backplane 11. The first reinforcing ribs 1106 are preferably bosses, which may be rectangular bosses, formed on the bottom plate. It will be appreciated that each of the bosses has an outer convex flat surface opposite to the display module, and four side surfaces (i.e., the offset surfaces of the boss) connected to the flat surface. The outer convex flat surface of the boss opposite to the display module is a support surface of the bottom plate, and an area defined between any two adjacent bosses is a rib pressing area.

Specifically, 14 boss reinforcing ribs may be provided and divided into different areas, covering the bottom plate 1101 of the backplane 11, and each of the boss reinforcing ribs may have a depth of 2 mm or 3 mm. In this embodiment, the first reinforcing ribs 1106 on the backplane 11 can effectively prevent the finished product from being distorted and deformed, thereby enhancing the strength of the backplane. The boss reinforcing rib is inclined at an offset joint, and the rectangular boss structure has an arched structure at corners, so as to prevent weakened local breaking strength of the backplane due to stress concentration caused by punching.

Figure 14:
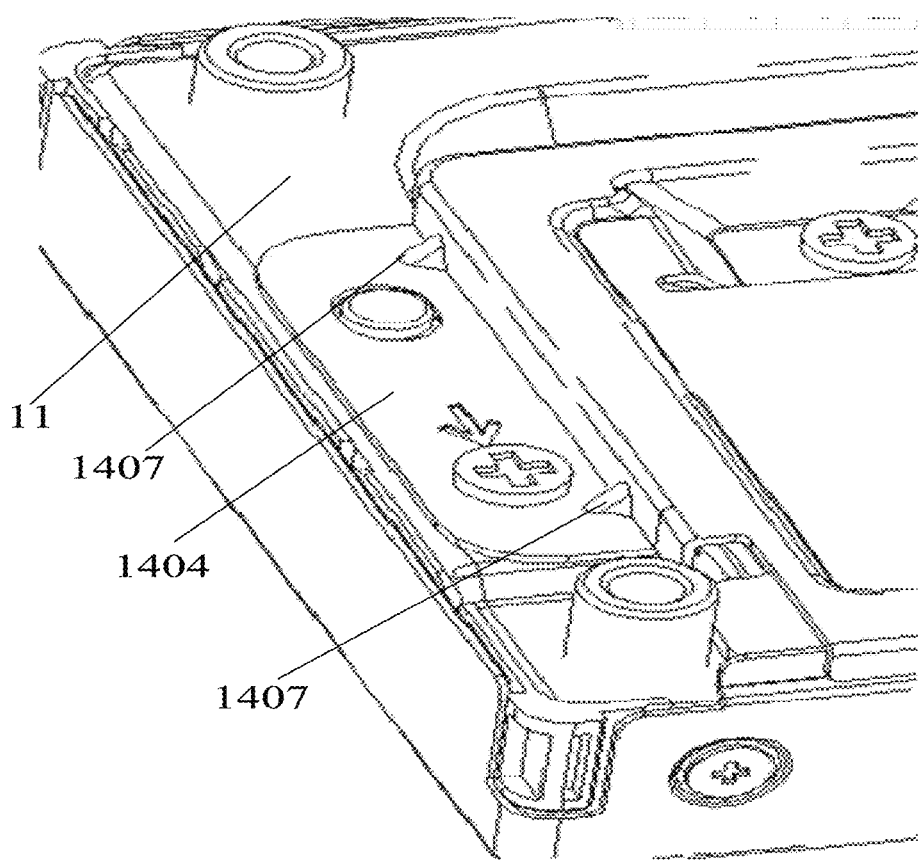
FIG. 14 is a schematic view illustrating the connection between the printed circuit board protective shell and the backplane according to an embodiment of the present disclosure.

In some embodiments of the present disclosure, as shown in FIG. 14, which is a schematic view illustrating the connection between the printed circuit board protective shell and the backplane according to an embodiment of the present disclosure, the third casing connecting portion 1404 and the fourth casing connecting portion 1405 of the printed circuit board protective shell 14 are connected to the backplane 11. Specifically, the third casing connecting portion 1404 and the fourth casing connecting portion 1405 may be connected by a screw. Also, an engaging slot may be disposed on each of the third casing connecting portion 1404 and the fourth casing connecting portion 1405, an engaging portion may be disposed on the backplane 11 at a position corresponding to the engaging slot, and the engaging slot is engaged with the engaging portion to further fix the printed circuit board protective shell 14 and the backplane 11. Obviously, the printed circuit board protective shell 14 and the backplane 11 engaged with each other through the engaging slot and the engaging portion facilitate assembly of the two. A side of the casing of the printed circuit board protective shell 14 closer to the second casing connecting portion 1403 is locked and attached to the printed circuit board 12 and the backplane 11 by the same screw.

A convex rib 1407 is provided at each support corner where the first casing connecting portion 1402 and the second casing connecting portion 1403 of the printed circuit board protective shell 14 are connected to the backplane 11, which may adopt, but is not limited to, a "bird's beak type" convex rib. Further, two (but not limited thereto) convex ribs 1407 may be provided at each support corner where the third casing connecting portion 1404 and the fourth casing connecting portion 1405 are connected to the backplane 11. In this manner, the position at which the third casing connecting portion 1404 and the fourth casing connecting portion 1405 of the printed circuit board protective shell 14 are connected can be designed to be reinforced. Specifically, when two convex ribs are provided on the third casing connecting portion 1404 and the fourth casing connecting portion 1405, the two ribs 1407 may be symmetrically disposed along a center line perpendicular to the length direction of the third casing connecting portion 1404, and preferably distributed at positions closer to corners in the length direction of the third casing connecting portion 1404. Similarly, the convex ribs of the fourth casing connecting portion 1405 may also be provided as such.

Figure 15:
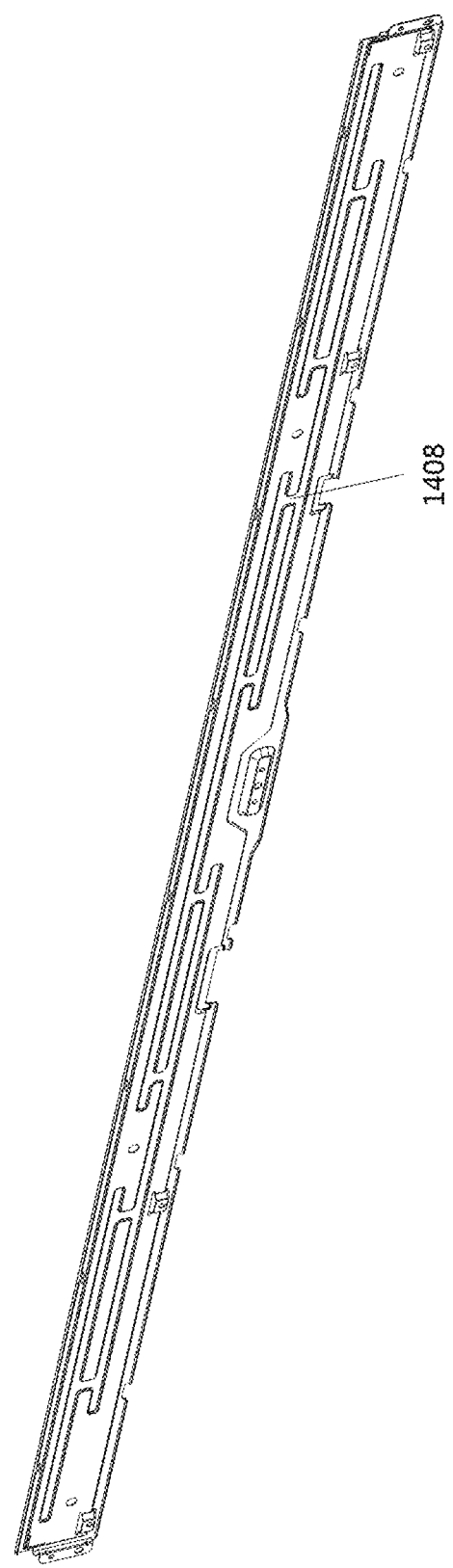
FIG. 15 is a schematic structural view of the second reinforcing rib on the printed circuit board protective shell according to an embodiment of the present disclosure.

In some embodiments of the present disclosure, as shown in FIG. 15, which is a schematic structural view of the second reinforcing rib on the printed circuit board protective shell according to an embodiment of the present disclosure, a second reinforcing rib 1408 is disposed on the casing 1401 of the printed circuit board protective shell 14 to enhance the strength of the casing. Specifically, the second reinforcing rib 1408 may be an I-shaped reinforcing rib formed on the casing. That is, the casing and the I-shaped reinforcing rib form an integral structure, and a continuous, closed I-shaped reinforcing rib is preferable. Obviously, the second reinforcing rib 1408 on the casing 1401 is not limited to an I-shape. It should be noted here that the I-shaped reinforcing rib is formed on the casing, that is, an I-shaped boss is formed on the casing 1401, which can enable a certain space between the electronic devices of the printed circuit board and the printed circuit board protective shell, so as to prevent the electronic devices from being affected by the sagged printed circuit board protective shell under impact of an external force.

The display panel according to the embodiments of the present disclosure is a display module with a very large aspect ratio, in which the front frame 1 of the display panel is engaged with the printed circuit board protective shell 14, and an integrated assembly structure is adopted to enhance the overall strength of the display panel; the bending design of the first connecting plate 1012 in the first front frame portion 101 of the front frame 1, the rectangular and divided reinforcing ribs on the backplane 11, the closed and continuous I-shaped reinforcing ribs adopted by the printed circuit board protective shell 14, the scheme of locking and attaching the front frame 1 and the backplane 11 by an optimized screw arrangement, and the backplane 1 abutting the middle frame 5, all effectively enhance the strength of the display panel.

In a second aspect, an embodiment of the present disclosure provides a display device, which may include any one of the display panels as described above.

The display device may include: a shelf electronic tag, a vehicle-mounted strip screen and any product or component having a display function.

It will be appreciated that the above implementations are merely exemplary implementations for the purpose of illustrating the principle of the disclosure, and the disclosure is not limited thereto. It will be apparent to those skilled in the art that various modifications and variations can be made to the disclosure without departing from the spirit or essence of the disclosure. Such modifications and variations should also be considered as falling into the protection scope of the disclosure.

What is claimed is:

1. A display panel, comprising:

a front frame comprising a first front frame portion and a second front frame portion extending in a length direction of the display panel; and a third front frame portion and a fourth front frame portion extending in a width direction of the display panel; wherein the first front frame portion and the second front frame portion are disposed oppositely; and the third front frame portion and the fourth front frame portion are disposed oppositely, and connected between the first front frame portion and the second front frame portion; and a printed circuit board protective shell engaged with the first front frame portion, wherein the first front frame portion comprises a first side plate, and a first connecting plate connected at an edge of the first side plate in a length direction thereof and extending toward a direction of the printed circuit board protective shell;

the second front frame portion comprises a second side plate, and a second connecting plate connected at an edge of the second side plate in a length direction thereof and extending toward the direction of the printed circuit board protective shell;

wherein the printed circuit board protective shell comprises a casing, and a first casing connecting portion connected at an edge of the casing in a length direction thereof and extending toward a direction of the first side plate;

wherein an edge of the first casing connecting portion in a length direction thereof is connected to a first engaging portion; a first engaging slot is disposed on the first connecting plate; and the first engaging portion and the first engaging slot are connected in a one-to-one correspondence manner;

wherein the display panel further comprises a backplane; the backplane comprises: a bottom plate, and a first bottom plate connecting portion and a second bottom plate connecting portion connected to an edge of the bottom plate in a length direction thereof and disposed oppositely; wherein the first bottom plate connecting portion is connected to the first connecting plate through a first screw;

the second bottom plate connecting portion is connected to the second connecting plate through a second screw, wherein the first bottom plate connecting portion is provided with a first rivet stud; the first rivet stud and the first screw are disposed in a one-to-one correspondence manner; and the screw connects the first connecting plate to the first bottom plate connecting portion via the first rivet stud;

the second bottom plate connecting portion is provided with a second rivet stud; the second rivet stud and the second screw are disposed in a one-to-one correspondence manner; and the second screw connects the second connecting plate to the second bottom plate connecting portion via the second rivet stud;

wherein the display panel further comprises a middle frame; the middle frame comprises a first middle frame portion and a second middle frame portion extending along a length direction of the display panel and disposed oppositely; wherein the first middle frame portion is engaged with the first bottom plate connecting portion; and the second middle frame portion is engaged with the second bottom plate connecting portion;

wherein a second engaging slot is disposed on the first middle frame portion, a second engaging portion is disposed on the first bottom plate connecting portion, and the second engaging slot and the second engaging portion are disposed in a one-to-one correspondence manner and engaged with each other; and a third engaging slot is disposed on the second middle frame portion, a third engaging portion is disposed on the second bottom plate connecting portion, the third engaging slot and the third engaging portion are disposed in a one-to-one correspondence manner and engaged with each other.

2. The display panel according to claim 1, wherein the edge of the first connecting plate in the length direction thereof is bent inward and extends in a direction away from the first side plate.

3. The display panel according to claim 2, wherein the edge of the first connecting plate in the length direction thereof comprises a bent depth of: 1.4 mm.

4. The display panel according to claim 1, wherein the second engaging portion and the first screw are alternatively disposed; and the third engaging portion and the second screw are alternatively disposed.

5. The display panel according to claim 1, wherein a plurality of first reinforcing ribs spaced apart are disposed on the bottom plate of the backplane.

6. The display panel according to claim 5, wherein the first reinforcing ribs are bosses formed on the bottom plate.

7. The display panel according to claim 6, wherein the printed circuit board protective shell comprises a casing, and a first casing connecting portion and a second casing connecting portion obtained by bending from an edge in a width direction of the casing and extending in a direction away from the casing; and the first casing connecting portion and the second casing connecting portion are both connected to the backplane.

8. The display panel according to claim 7, wherein a convex rib is disposed at a support corner position of each of the first casing connecting portion and the second casing connecting portion.

9. The display panel according to claim 8, wherein each of the first casing connecting portion and the second casing connecting portion is provided with two convex ribs at the support corner position.

10. The display panel according to claim 7, wherein the casing has a second reinforcing rib.

11. The display panel according to claim 10, wherein the second reinforcing rib comprises an I-shaped reinforcing rib formed on the casing.

12. The display panel according to claim 1, wherein the display panel comprises an aspect ratio of 20:1 to 24:1.

* * * * *

UNITED STATES PATENT AND TRADEMARK OFFICE
CERTIFICATE OF CORRECTION

| | |
|---|---|
| PATENT NO. | : 11,540,403 B2 |
| APPLICATION NO. | : 16/962588 |
| DATED | : December 27, 2022 |
| INVENTOR(S) | : Jiangfeng Zhang et al. |

It is certified that error appears in the above-identified patent and that said Letters Patent is hereby corrected as shown below:

On the Title Page

Please delete Item (73) the Assignee "BOE TECHNOLOGY GROUP CO., LTD" and replace with "BOE TECHNOLOGY GROUP CO., LTD.".

Signed and Sealed this
Twenty-first Day of February, 2023

Katherine Kelly Vidal
*Director of the United States Patent and Trademark Office*